(12) United States Patent
Hsieh et al.

(10) Patent No.: US 8,872,149 B1
(45) Date of Patent: Oct. 28, 2014

(54) RRAM STRUCTURE AND PROCESS USING COMPOSITE SPACER

(71) Applicant: Taiwan Semiconductor Manufacturing Company, Ltd., Hsin-Chu (TW)

(72) Inventors: Ching-Pei Hsieh, Kaohsiung (TW);
Fu-Ting Sung, Yangmei (TW);
Chern-Yow Hsu, Chu-Bei (TW);
Shih-Chang Liu, Alian Township (TW);
Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/954,430

(22) Filed: Jul. 30, 2013

(51) Int. Cl.
*H01L 29/06* (2006.01)
*H01L 21/00* (2006.01)

(52) U.S. Cl.
USPC ............ 257/2; 257/E21.664; 257/E29.003; 438/95

(58) Field of Classification Search
None
See application file for complete search history.

(56) References Cited

U.S. PATENT DOCUMENTS

2003/0047762 A1* 3/2003 Lowrey .................. 257/276

OTHER PUBLICATIONS

Kuo-Chi Tu et al., specification and drawings entitled "Logic Compatible RRAM Structure and Process", U.S. Appl. No. 13/831,629, filed Mar. 15, 2013, 36 pages.

* cited by examiner

*Primary Examiner* — Michael Lebentritt
*Assistant Examiner* — Kevin Quinto
(74) *Attorney, Agent, or Firm* — Haynes and Boone, LLP

(57) ABSTRACT

A memory cell and method includes a first electrode formed in an opening in a first dielectric layer, the first dielectric layer being formed on a substrate including a metal layer, the opening being configured to allow physical contact between the first electrode and the metal layer, the first electrode having a first width $W_1$ and extending a distance beyond a region defined by the opening, a resistive layer formed on the first electrode and having substantially the first width $W_1$, a capping layer, having a second width $W_2$ less than the first width $W_1$, formed on the resistive layer, a second electrode formed on the capping layer and having substantially the second width $W_2$, a first composite spacer region having at least two different dielectric layers formed on the resistive layer between the first width $W_1$ and the second width $W_2$, and a via coupled to the second electrode.

20 Claims, 9 Drawing Sheets

RRAM STRUCTURE AND PROCESS USING COMPOSITE SPACER

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Many of the technological advances in semiconductors have occurred in the field of memory devices. Resistive random access memory (RRAM) is a nonvolatile memory type that is one possible candidate for future advancement in memory technology. Generally, RRAM cells typically use a dielectric material, which although normally insulating can be made to conduct through a filament or conduction path formed after application of a specific voltage. Once the filament is formed, it may be set (i.e., re-formed, resulting in a lower resistance across the RRAM cell) or reset (i.e., broken, resulting in a high resistance across the RRAM cell) by appropriately applied voltages. The low and high resistance states can be utilized to indicate a digital signal of "1" or "0" depending upon the resistance state, and thereby provide a non-volatile memory cell that can store a bit.

Embedded memory products, like many other semiconductor products, face fabrication time and cost pressures. The ability to fabricate RRAM cells using smaller, more densely packed RRAM cells is highly desirable. Accordingly, it would be desirable to provide an improved RRAM cell structure and fabrication process.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

Figure 1:
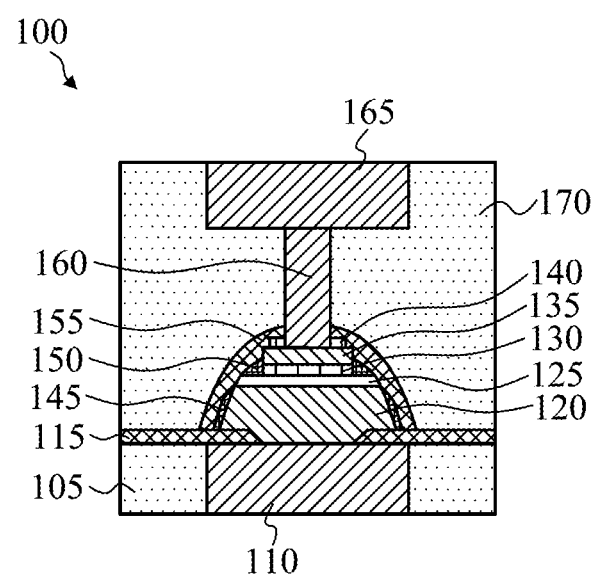
FIG. 1 is a simplified diagram showing a cross-sectional representation of a RRAM cell according to certain embodiments.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

FIG. 1 is a simplified diagram showing a cross-sectional representation of a RRAM cell 100 according to certain embodiments. As shown in FIG. 1, the RRAM cell 100 may be formed on a substrate including a first dielectric region 105 with an embedded first metal layer 110. The first metal layer 110 may be used as a first contact and is used to couple the RRAM cell 100 to other circuitry in the semiconductor device. The first metal layer 110 may be in any metallization layer of a semiconductor device including any one of the first, second, third, fourth, or fifth metallization layers.

A first stop layer 115 is formed over the first dielectric region 105 and the first metal layer 110. A portion of the first stop layer 115 is removed to create an opening that may expose at least a portion of the first metal layer 110 to the RRAM cell 100. In some embodiments, the first stop layer 115 typically has a thickness between 30 nm and 40 nm. According to some embodiments, the first stop layer 115 includes one or more dielectrics. For example, each of the one or more dielectrics is selected from a group consisting of SiC, SiON, $Si_3N_4$, and the like.

A first electrode 120 is formed over the first stop layer 115 and the exposed first metal layer 110. In some embodiments, the first electrode 120 may be conformal. The first electrode 120 has a width $W_1$ and extends over the exposed first metal layer 110 and forms a lip region that extends over a portion of the first stop layer 115. In some embodiments, the lip region may extend beyond the opening in the first stop layer 115 a distance that varies between 20 nm and 60 nm. In some embodiments, the first electrode 120 may vary in thickness between 40 nm and 60 nm. In some embodiments, the first electrode 120 may include tapered side walls that are wider at the base where they contact the stop layer 115. In some embodiments, the first electrode 120 includes one or more metals. For example, each of the one or more metals is selected from a group consisting of Pt, AlCu, TiN, Au, Ti, Ta, TaN, W, WN, Cu, and the like.

A resistive layer 125 is formed over the first electrode 120. The resistive layer 125 extends over the first electrode 120 and forms a lip region that extends to substantially the same width as the upper portion of tapered side walls of the first electrode 120. In some embodiments, the resistive layer 125 may vary in thickness between 5 nm and 7 nm. In some examples, the resistive layer 125 includes tapered side walls that continue the tapering of the first electrode 120. In some embodiments, the resistive layer 125 includes one or more metal oxides. For example, the one or more metal oxides are each selected from a group consisting of NiO, TiO, HfO, ZrO, ZnO, WO$_3$, Al$_2$O$_3$, TaO, MoO, CuO, and the like. In some embodiments, a dielectric constant for the resistive layer 125 is greater than 4.0. In some embodiments, the resistive layer may include HfO with a resistivity on the order of $10^{14}$ Ω·cm. According to some embodiments, the resistive layer 125 has a high resistance state that varies between 100 kΩ and 10 MΩ and a low resistance state that varies between 1 kΩ and 100 kΩ.

A capping layer 130 is formed over the resistive layer 125. The capping layer 130 has a width W$_2$, shorter than width W$_1$, and partially extends over the resistive layer 125. In some embodiments, the capping layer 130 may extend over the resistive layer 125 to within 10 nm to 30 nm of the end of the lip region on the resistive layer 125. In some embodiments, the capping layer 130 may vary in thickness between 5 nm and 7 nm. In some embodiments, the capping layer 130 includes one or more metals. In some examples, each of the one or more metals is selected from a group consisting of Ti, Ir, and the like.

A second electrode 135 is formed on the capping layer 130. The second electrode 135 extends over the capping layer 130 to substantially the same width as the capping layer 130. In some embodiments, a width of the second electrode 135 is within a few nanometers or less of the second width W$_2$ of the capping layer 130. In some embodiments, the second electrode 135 may vary in thickness between 40 nm and 60 nm. In some embodiments, the second electrode 135 includes one or more metals. For example, each of the one or more metals is selected from a group consisting of Pt, AlCu, TiN, Au, Ti, Ta, TaN, W, WN, Cu, and the like.

A hard mask layer 140 is formed on the second electrode 135. The hard mask layer 140 extends over the second electrode 135 to substantially the same width as the second electrode 135. A portion of the hard mask layer 140 is removed from a central region of the hard mask layer 140 to expose a portion of the second electrode 135 so that an electrical connection can be made. In some embodiments, the hard mask layer 140 may vary in thickness between 9 nm and 10 nm. According to some embodiments, the hard mask layer 140 includes one or more dielectrics. For example, each of the one or more dielectrics is selected from a group consisting of SiC, SiON, Si$_3$N$_4$, and the like.

A first spacer region 145 at least partially protects the side walls of the first electrode 120. In some embodiments, the first spacer region 145 may be only a few nanometers wide or less. In some embodiments, the first spacer region 145 includes one or more dielectrics. For example, each of the one or more dielectrics is selected from a group consisting of SiC, SiON, Si$_3$N$_4$, and the like.

A second spacer region 150 at least partially protects the side walls of the second electrode 135. In some embodiments, the second spacer region 150 may be only a few nanometers wide or less. In some embodiments, the second spacer region 155 includes one or more dielectrics. For example, each of the one or more dielectrics is selected from a group consisting of SiC, SiON, Si$_3$N$_4$, and the like.

A second stop layer 155 is conformally formed over the first spacer region 145, the first electrode 120, the resistive layer 125, the second spacer region 150, the second electrode 135, and the hard mask layer 140. A portion of the second stop layer 155 is removed to expose the central region of the second electrode 135 so that an electrical connection can be made. In some embodiments, the second stop layer 155 may vary in thickness between 30 nm and 40 nm. In some embodiments, the second stop layer 155 may form an extension to the first stop layer 115. According to some embodiments, the second stop layer 155 includes one or more dielectrics. For example, each of the one or more dielectrics is selected from a group consisting of SiC, SiON, Si$_3$N$_4$, and the like.

The RRAM cell 100 is coupled to a second metal layer 165 through a via 160 formed between the second metal layer 165 and the second electrode 135. The upper portion of the RRAM cell is embedded in a second dielectric region 170. The second metal layer 165 may be in any metallization layer of the semiconductor device including any one of the second, third, fourth, fifth, or sixth metallization layers.

Figure 2:
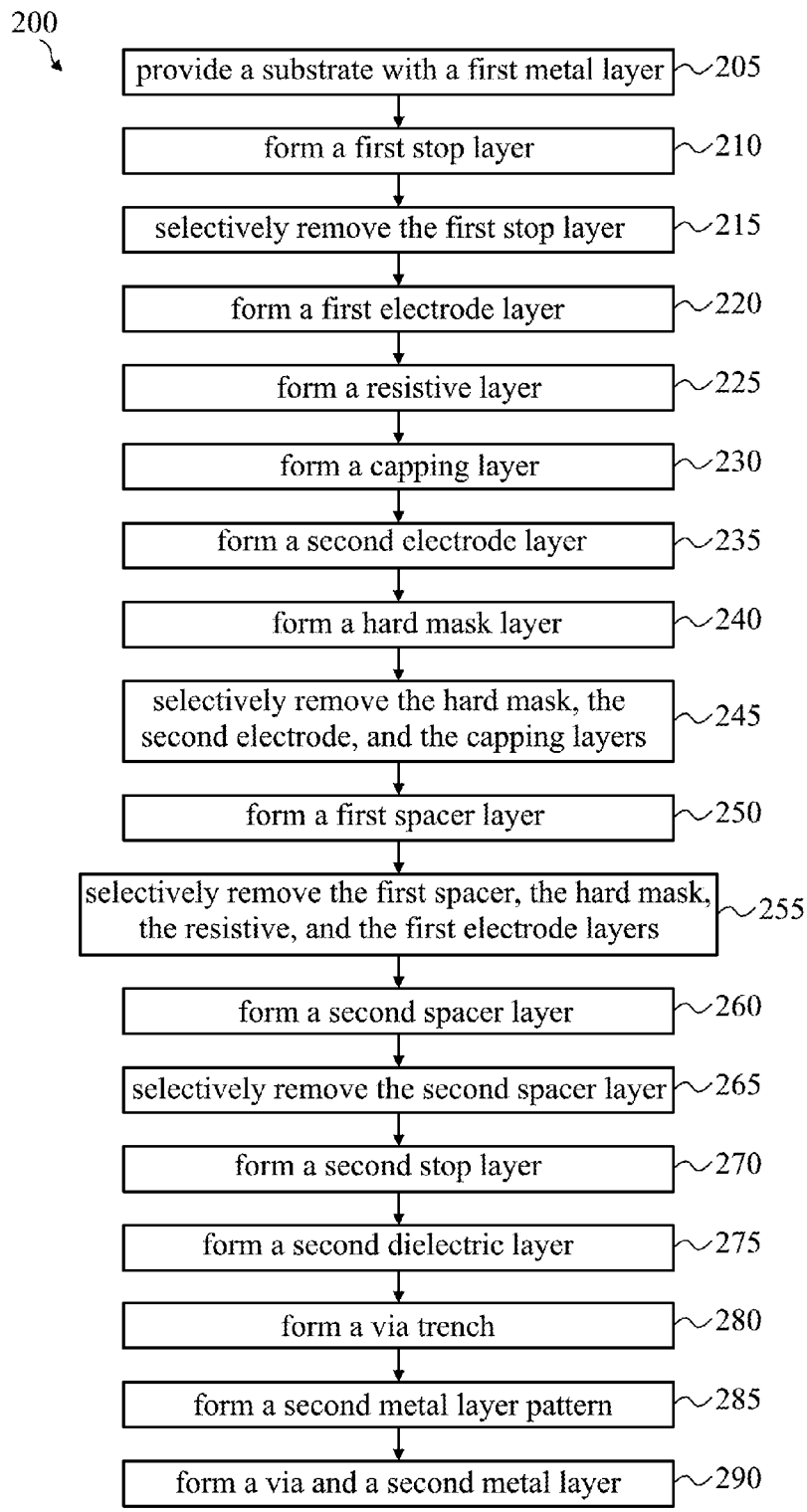
FIG. 2 is a simplified diagram showing a method for making the RRAM cell of FIG. 1 according to certain embodiments.

FIG. 2 is a simplified diagram showing a method 200 for making the RRAM cell 100 of FIG. 1 according to certain embodiments. As shown in FIG. 2, the method 200 includes a process 205 for providing a substrate with a first metal layer, a process 210 for forming a first stop layer, a process 215 for selectively removing the first stop layer, a process 220 for forming a first electrode layer, a process 225 for forming a resistive layer, a process 230 for forming a capping layer, a process 235 for forming a second electrode layer, a process 240 for forming a hard mask layer, a process 245 for selectively removing the hard mask, the second electrode, and the capping layers, a process 250 for forming a first spacer layer, a process 255 for selectively removing the first spacer, the hard mask, the resistive, and the first electrode layers, a process 260 for forming a second spacer layer, a process 265 for selectively removing the second spacer layer, a process 270 for forming a second stop layer, a process 275 for forming a second dielectric layer, a process 280 for forming a via trench, a process 285 for forming a second metal layer pattern, and a process 290 for forming a via and a second metal layer. According to certain embodiments, the method 200 of making an RRAM cell 200 can be performed using variations among the processes 205-290 as would be recognized by one of ordinary skill in the art.

The method 200 will be further described below with reference to a series of cross-sectional images in FIGS. 3A-3M, culminating in the RRAM cell 100.

Figure 3A:
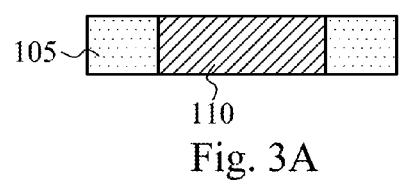
FIGS. 3A-3M show simplified diagrams of cross-sectional representations of a partially formed RRAM cell according to certain embodiments.

FIG. 3A shows a simplified diagram of a cross-sectional representation of a substrate according to certain embodiments. At the process 205, the substrate with a first metal layer 110 as shown in FIG. 3A is provided. The substrate includes the first metal layer 110 embedded in a first dielectric region 105 in the area of an RRAM cell. The substrate is formed using any suitable process and may have been previously planarized using chemical-mechanical polishing (CMP).

Figure 3B:
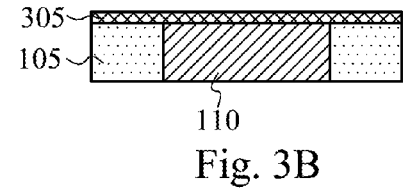

FIG. 3B shows a simplified diagram of a cross-sectional representation of the partially formed RRAM cell with a first stop layer 305 formed thereon according to certain embodiments. At the process 210, a first stop layer 305 is formed on the substrate as shown in FIG. 3B. The first stop layer 305 is formed over the first dielectric region 105 and the first metal layer 110. The first stop layer 305 is typically formed using chemical vapor deposition (CVD) or physical vapor deposition (PVD). However, any suitable deposition process may be used in process 210 to form the first stop layer 305. In some embodiments, the first stop layer 305 may have a thickness between 30 nm and 40 nm. According to some embodiments, the first stop layer 305 includes one or more dielectrics. For example, each of the one or more dielectrics is selected from a group consisting of SiC, SiON, Si$_3$N$_4$, and the like.

Figure 3C:
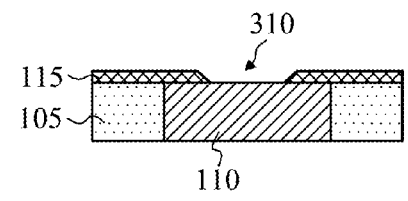

FIG. 3C shows a simplified diagram of a cross-sectional representation of the partially formed RRAM cell with a portion of the first stop layer 305 selectively removed according to certain embodiments. At the process 215, a portion of the first stop layer 305 is selectively removed to form an opening 310 as shown in FIG. 3C. The opening 310 is typically located in the area of the first metal layer 110 and is removed to expose a portion of the first metal layer 110 for further processing. The portion of the first stop layer 305 is typically removed using a photolithography process using a mask. For example, the photolithography process using a mask is a multi-step process involving coating a substrate with a photoresist, baking the photoresist, exposing the photoresist with a pattern mask identifying the regions where material is to be removed and where material is to be kept, developing the photoresist to form an etching pattern, etching away a portion of the substrate using a wet or dry etching process, and removing the photoresist. According to some embodiments, the first stop layer 305 may be etched using a dry etching process, however any suitable etching process may be used. After forming the opening 310, the first stop layer 305 becomes the first stop layer 115.

Figure 3D:
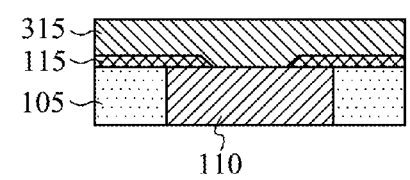

FIG. 3D shows a simplified diagram of a cross-sectional representation of the partially formed RRAM cell with a first electrode layer 315 formed thereon according to certain embodiments. At the process 220, the first electrode layer 315 is formed on the first stop layer 115 and the first metal layer 110. The first electrode layer 315 is typically formed using CVD, PVD, or atomic layer deposition (ALD). However, any suitable deposition process may be used in process 220 to form the first electrode layer 315. The first electrode layer 315 is typically conformal. In some embodiments, the first electrode layer 315 can typically have a thickness between 40 nm and 60 nm. In some embodiments, the first electrode layer 315 includes one or more metals. For example, each of the one or more metals is selected from a group consisting of Pt, AlCu, TiN, Au, Ti, Ta, TaN, W, WN, Cu, and the like.

Figure 3E:
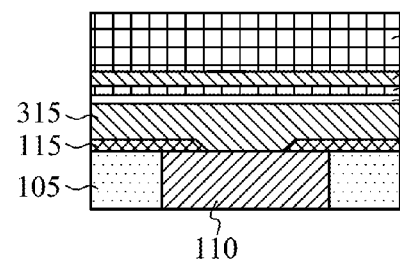

FIG. 3E shows a simplified diagram of a cross-sectional representation of the partially formed RRAM cell with a resistive layer 320, a capping layer 325, a second electrode layer 330, and a hard mask layer 335 formed thereon according to certain embodiments of the present invention. At the process 225 the resistive layer 320 is formed on the first electrode layer 315. The resistive layer 320 is typically formed using CVD or ALD. However, any suitable deposition process may be used in process 225 to form the resistive layer 320. In some embodiments, the resistive layer 320 may have a thickness between 5 nm and 7 nm. In some embodiments, the resistive layer 320 includes one or more metal oxides. For example, the one or more metal oxides are each selected from a group consisting of NiO, TiO, HfO, ZrO, ZnO, $WO_3$, $Al_2O_3$, TaO, MoO, CuO, and the like.

At the process 230, the capping layer 325 is formed on the resistive layer 320. The capping layer 325 is typically formed using CVD, PVD, or ALD. However, any suitable deposition process may be used in process 230 to form the capping layer 325. In some embodiments, the capping layer 325 may have a thickness between 5 nm and 7 nm. In some embodiments, the capping layer 325 includes one or more metals. In some examples, each of the one or more metals is selected from a group consisting of Ti, Ir, and the like.

At the process 235, the second electrode layer 330 is formed on the capping layer 325. The second electrode layer 330 is typically formed using CVD, PVD, or ALD. However, any suitable deposition process may be used in process 235 to form the second electrode layer 330. In some embodiments, the second electrode layer 330 may have a thickness between 40 nm and 60 nm. In some embodiments, the second electrode layer 330 includes one or more metals. For example, each of the one or more metals is selected from a group consisting of Pt, AlCu, TiN, Au, Ti, Ta, TaN, W, WN, Cu, and the like.

At the process 240, a hard mask layer 335 is formed as shown in FIG. 3E. The hard mask layer 335 is formed over the second electrode layer 330. The hard mask layer 335 is typically formed using CVD or PVD. However, any suitable deposition process may be used in process 240 to form the hard mask layer 335. In some embodiments, the hard mask layer 335 may typically have a thickness between 9 nm and 10 nm. According to some embodiments, the hard mask layer 335 includes one or more dielectrics. For example, each of the one or more dielectrics is selected from a group consisting of SiC, SiON, $Si_3N_4$, and the like.

Figure 3F:
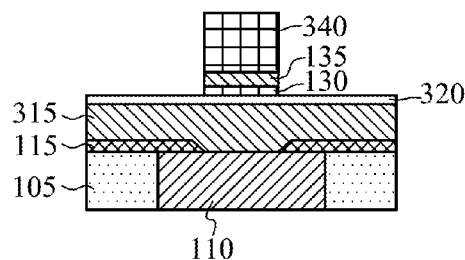

FIG. 3F shows a simplified diagram of a cross-sectional representation of the partially formed RRAM cell after removal of portions of the hard mask layer 325, the second electrode layer 330, and the capping layer 325 according to certain embodiments. At the process 244 selected portions of the hard mask layer 335, the second electrode layer 330, and the capping layer 325 are removed as shown in FIG. 3F. The selected portions of the hard mask layer 335, the second electrode layer 330, and the capping layer 325 are typically removed using a photolithography process using a mask. In some embodiments, the mask may include both a photosensitive and a non-photo-sensitive mask layer. According to some embodiments, the hard mask layer 325, the second electrode layer 330, and the capping layer 325 may be etched using a dry etching process, however any suitable etching process may be used. Sufficient portions of the hard mask layer 335 are removed to form a hard mask layer portion 340 within the RRAM cell, sufficient portions of the second electrode layer 330 are removed to form the second electrode 135, and sufficient portions of the capping layer 330 are removed to form the capping layer 130. Only sufficient portions of the hard mask layer 325, the second electrode layer 330, and the capping layer 325 are removed so that the hard mask layer 325, the second electrode layer 330, and the capping layer 325 collectively have a width $W_2$. In some embodiments, the hard mask layer 325, the second electrode layer 330, and the capping layer 325 may extend beyond an area defined by the opening 310 (see FIG. 3C) in the first stop layer 305 by a first distance. According to some embodiments, the first distance may vary in length between 10 nm to 30 nm on each side of the opening 310.

Figure 3G:
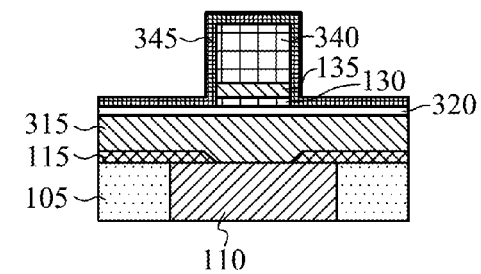

FIG. 3G shows a simplified diagram of a cross-sectional representation of the partially formed RRAM cell after a first spacer layer is formed over the partially formed RRAM cell according to certain embodiments. At the process 250, a first spacer layer 345 is conformally formed over the resistive layer 320, the capping layer 130, the second electrode 135, and the hard mask layer portion 340. The first spacer layer 345 is typically formed using CVD or PVD. However, any suitable deposition process may be used in process 250 to form the first spacer layer 345. In some embodiments, the first spacer layer 345 may typically have a thickness between 30 nm and 50 nm. According to some embodiments, the first spacer layer 345 includes one or more dielectrics. For example, each of the one or more dielectrics is selected from a group consisting of SiC, SiON, $Si_3N_4$, and the like.

Figure 3H:
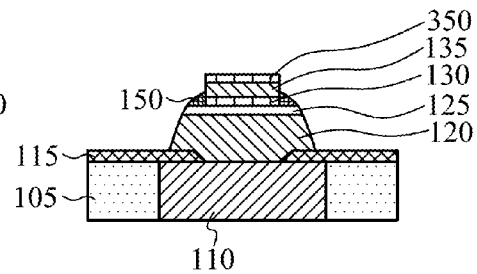

FIG. 3H shows a simplified diagram of a cross-sectional representation of the partially formed RRAM cell after removal of portions of the first spacer layer 345, the hard mask layer portion 340, the resistive layer 320, and the first electrode layer 315 according to certain embodiments. At the process 255 selected portions of the first spacer layer 345, the hard mask layer portion 340, the resistive layer 320, and first electrode layer 315 are removed as shown in FIG. 3H. The selected portions of the first spacer layer 345, the hard mask layer portion 340, the resistive layer 320, and the first electrode layer 315 are typically removed using a photolithography process using a mask. According to some embodiments, the first spacer layer 345, the hard mask layer portion 340, the resistive layer 320, and the first electrode layer 315 may be etched using a dry etching process, however any suitable etching process may be used. Sufficient portions of the resistive layer 320 are removed to form the resistive layer 125, sufficient portions of the first electrode layer 315 are removed to form the first electrode 120, sufficient portions of the first spacer layer 345 are removed to form the second spacer region 150, and the hard mask layer portion 340 is thinned to form a thinned hard mask layer portion 350. Only sufficient portions of the resistive layer 320 and the first electrode layer 315 are removed so that both the resistive layer 125 and the first electrode 120 collectively have a width $W_1$, longer than width $W_2$, and form a lip region over the first stop layer 115 that extends beyond an area defined by the opening 310 (see FIG. 3C) in the first stop layer 305. According to some embodiments, the lip region may extend beyond the opening 310 by 20 nm to 60 nm on each side.

The first spacer layer 345 provides some protection to the partially formed RRAM cell during the material removal of process 255. In some embodiments, side walls of the thinned hard mask portion 350, the second electrode 135, and the capping layer 130 are protected by the second spacer region 150 so that the side walls of the thinned hard mask portion 350, the second electrode 135, and the capping layer 130 remain substantially vertical. In contrast, in some embodiments, the first spacer layer 345 is not able to adequately protect the side walls of the resistive layer 125 and the first electrode 120. This results in tapering of the side walls of the resistive layer 125 and the first electrode 120. In some embodiments, the taper of the side walls of the resistive layer 125 and the first electrode 120 may result in the width of the first electrode 120 where it contacts the first stop layer 115 being as much as 30 nm to 50 nm wider than the width of the resistive layer 125 where it contacts the capping layer 130. According to some embodiments, the tapering of the side walls of the resistive layer 125 and the first electrode 120 may result in degraded performance of the RRAM cell 100. Additionally, this degraded performance may require that the RRAM cell 100 be larger in size to compensate for the degraded performance and may result in lower packing density of RRAM cells 100 in a semiconductor device.

Figure 3I:
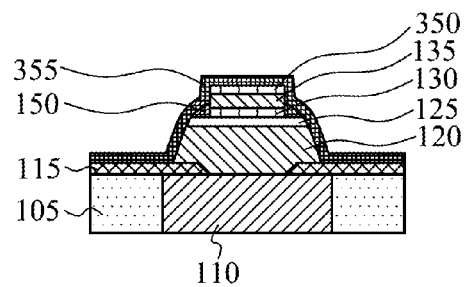

FIG. 3I shows a simplified diagram of a cross-sectional representation of the partially formed RRAM cell after a second spacer layer is formed over the partially formed RRAM cell according to certain embodiments. At the process 260, a second spacer layer 355 is conformally formed over the thinned hard mask portion 350, the second electrode 135, the capping layer 130, the second spacer region 150, the resistive layer 125, the first electrode 120, and the first stop layer 115. The second spacer layer 355 is typically formed using CVD or PVD. However, any suitable deposition process may be used in process 260 to form the second spacer layer 355. In some embodiments, the second spacer layer 355 may typically have a thickness between 30 nm and 50 nm. According to some embodiments, the second spacer layer 355 includes one or more dielectrics. For example, each of the one or more dielectrics is selected from a group consisting of SiC, SiON, $Si_3N_4$, and the like.

Figure 3J:
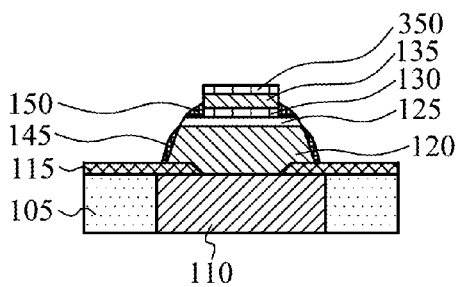

FIG. 3J shows a simplified diagram of a cross-sectional representation of the partially formed RRAM cell after portions of the second spacer layer 355 is selectively removed from the partially formed RRAM cell according to certain embodiments. At the process 265, portions of the second spacer layer 355 is selectively removed. The selected portions of the second spacer layer 350 are typically removed using a photolithography process using a mask. According to some embodiments, the second spacer layer 355 may be etched using a dry etching process, however any suitable etching process may be used. Sufficient portions of the second spacer layer 355 are removed to form the first spacer region 145. The first spacer region 145 at least partially protects the side walls of the first electrode 120. In some embodiments, the first spacer region 145 may be only a few nanometers wide or less.

Figure 3K:
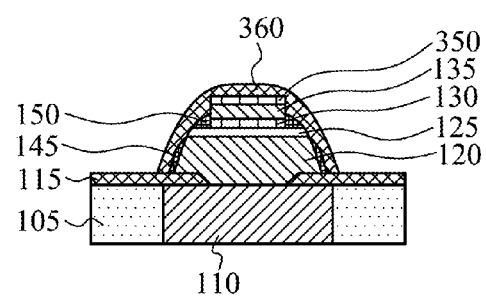

FIG. 3K shows a simplified diagram of a cross-sectional representation of the partially formed RRAM cell with a second stop layer 360 formed thereon according to certain embodiments. At the process 270, the second stop layer 360 is conformally formed over the thinned hard mask portion 350, the second electrode 135, the capping layer 130, the second spacer region 155, the resistive layer 125, the first electrode 120, and the first spacer region 150. The second stop layer 360 is typically formed using CVD or PVD, however, any suitable deposition process may be used in process 270 to form the second stop layer 360. In some embodiments, the second stop layer 360 may have a thickness between 30 nm and 40 nm. According to some embodiments, the second stop layer 360 includes one or more dielectrics. For example, each of the one or more dielectrics is selected from a group consisting of SiC, SiON, $Si_3N_4$, and the like.

Figure 3L:
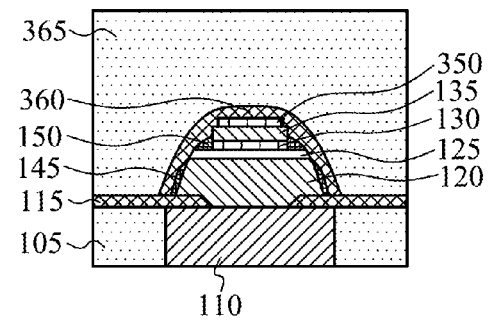

FIG. 3L shows a simplified diagram of a cross-sectional representation of the partially formed RRAM cell with a second dielectric region 365 formed thereon according to certain embodiments. At the process 275, the second dielectric region 365 is typically formed using CVD, PVD, or ALD. However, any suitable deposition process may be used in process 275 to form the second dielectric region 365. In some embodiments, the second dielectric regions 265 is an interlayer dielectric region.

Figure 3M:
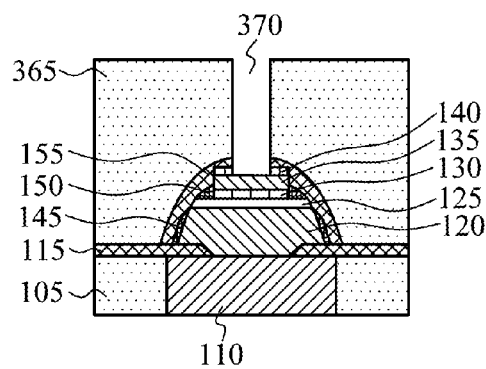

FIG. 3M shows a simplified diagram of a cross-sectional representation of the partially formed RRAM cell with a via trench 370 formed in the second dielectric region 365, the second stop layer 360, and the thinned hard mask portion 350 according to certain embodiments. At the process 280, portions of the second dielectric region 365, the second stop layer 360, and the thinned hard mask portion 350 are selectively removed to form the via trench 370. The via trench 370 is typically created using a photolithography process using a mask. According to some embodiments, the via trench 370 may require a two step etching processing. The first etching step can be used to selectively remove a portion of the second dielectric region 365 where the via trench 370 is desired. The second etching step can be used to selectively remove a portion of the second stop layer 360 and the thinned hard mask portion 350, thus forming the second stop layer 155 and the hard mask layer 140 and exposing the second electrode 135.

At the process 285, a second metal pattern is formed in the second dielectric region 365. Portions of the second dielectric region 365 are typically removed using a photolithography process using a mask to form the second metal pattern and the second dielectric region 170. According to some embodiments, the second dielectric region 365 may be etched using a dry etching process, however any suitable etching process may be used.

At the process 290, via 160 and second metal layer 165 are formed in the second dielectric region 170 to complete the RRAM cell 100 as shown in FIG. 1. The via 160 and the second metal layer 165 are typically formed using CVD, PVD, or ALD. However, any suitable deposition process may be used in process 290 to form the via 160 and the second metal layer 165.

Figure 4:
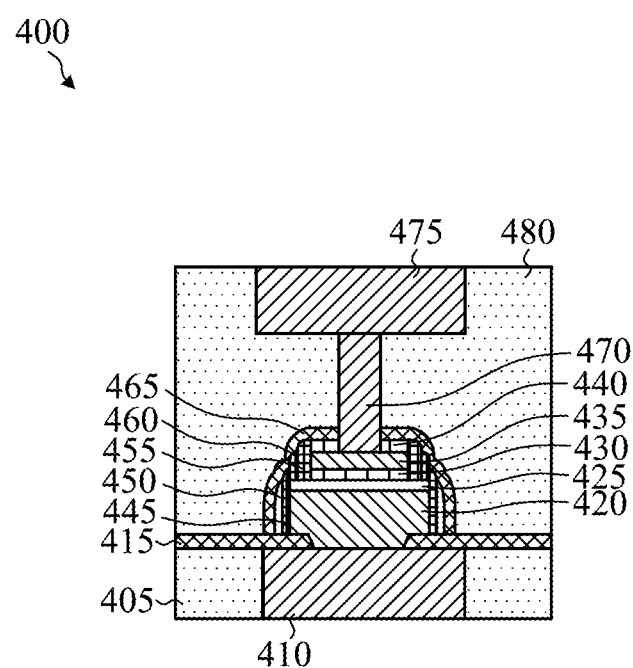
FIG. 4 is a simplified diagram showing a cross-sectional representation of a RRAM cell according to certain embodiments.

FIG. 4 is a simplified diagram showing a cross-sectional representation of a RRAM cell 400 according to certain embodiments. As shown in FIG. 4, the RRAM cell 400 may be formed on a substrate including a first dielectric region 405 with an embedded first metal layer 410. The first metal layer 410 may be used as a first contact and is used to couple the RRAM cell 400 to other circuitry in the semiconductor device. The first metal layer 410 may be in any metallization layer of a semiconductor device including any one of the first, second, third, fourth, or fifth metallization layers. In some embodiments, the first dielectric region 405 may be the first dielectric region 105 and the first metal layer 410 may be the first metal layer 110.

A first stop layer 415 is formed over the first dielectric region 405 and the first metal layer 410. A portion of the first stop layer 415 is removed to create an opening that may expose at least a portion of the first metal layer 410 to the RRAM cell 400. In some embodiments, the first stop layer 415 typically has a thickness between 30 nm and 40 nm. According to some embodiments, the first stop layer 415 includes one or more dielectrics. For example, each of the one or more dielectrics is selected from a group consisting of SiC, SiON, $Si_3N_4$, and the like. In some embodiments, the first stop layer 415 may be the first stop layer 115.

A first or bottom electrode 420 is formed over the first stop layer 415 and the exposed first metal layer 410. In some embodiments, the first electrode 420 may be conformal. The first electrode 420 has a width $W_1$ and extends over the exposed first metal layer 410 and forms a lip region that extends over a portion of the first stop layer 415. In some embodiments, the lip region may extend beyond the opening in the first stop layer 415 a distance that varies between 20 nm and 60 nm. In some embodiments, the first electrode 420 may vary in thickness between 40 nm and 60 nm. In some embodiments, the first electrode 420 may include side walls that are substantially vertical having less than a few nanometers, or even less than 1 nm, variation from vertical. In some embodiments, the first electrode 420 includes one or more metals. For example, each of the one or more metals is selected from a group consisting of Pt, AlCu, TiN, Au, Ti, Ta, TaN, W, WN, Cu, and the like.

A resistive or high-k layer 425 is formed over the first electrode 420. The resistive layer 425 extends over the first electrode 420 and forms a lip region that extends to substantially the same width as the first electrode 420. In some embodiments, a width of the resistive layer 425 is within a few nanometers or less of the first width $W_1$ of the first electrode 420. In some embodiments, the resistive layer 425 may vary in thickness between 5 nm and 7 nm. In some examples, the resistive layer 425 includes side walls that are substantially vertical having less than a few nanometers, or even less than 1 nm, variation from vertical. In some embodiments, the resistive layer 425 includes one or more metal oxides. For example, the one or more metal oxides are each selected from a group consisting of NiO, TiO, HfO, ZrO, ZnO, $WO_3$, $Al_2O_3$, TaO, MoO, CuO, and the like. In some embodiments, a dielectric constant for the resistive layer 425 is greater than 4.0. In some embodiments, the resistive layer may include HfO with a resistivity on the order of $40^{14}$ Ω·cm. According to some embodiments, the resistive layer 425 has a high resistance state that varies between 400 kΩ and 40 MΩ and a low resistance state that varies between 4 kΩ and 400 kΩ.

A capping or protective layer 430 is formed over the resistive layer 425. The capping layer 430 has a width $W_2$, shorter than width $W_1$, and partially extends over the resistive layer 425. In some embodiments, the capping layer 430 may extend over the resistive layer 425 to within 10 nm to 30 nm of the end of the lip region on the resistive layer 425. In some embodiments, the capping layer 430 may vary in thickness between 5 nm and 7 nm. In some embodiments, the capping layer 430 includes one or more metals. In some examples, each of the one or more metals is selected from a group consisting of Ti, Ir, and the like.

A second or top electrode 435 is formed on the capping layer 430. The second electrode 435 extends over the capping layer 430 to substantially the same width as the capping layer 430. In some embodiments, a width of the second electrode 435 is within a few nanometers or less of the second width $W_2$ of the capping layer 430. In some embodiments, the second electrode 435 may vary in thickness between 40 nm and 60 nm. In some embodiments, the second electrode 435 includes one or more metals. For example, each of the one or more metals is selected from a group consisting of Pt, AlCu, TiN, Au, Ti, Ta, TaN, W, WN, Cu, and the like.

A hard mask layer 440 is formed on the second electrode 435. The hard mask layer 440 extends over the second electrode 435 to substantially the same width as the second electrode 435. A portion of the hard mask layer 440 is removed from a central region of the hard mask layer 440 to expose a portion of the second electrode 435 so that an electrical connection can be made. In some embodiments, the hard mask layer 440 may vary in thickness between 9 nm and 10 nm. According to some embodiments, the hard mask layer 440 includes one or more dielectrics. For example, each of the one or more dielectrics is selected from a group consisting of SiC, SiON, $Si_3N_4$, and the like.

A first composite spacer protects the side walls of the first electrode 420 and the resistive layer 425. The first composite spacer includes a first spacer region 445 and a second spacer region 450. In some embodiments, the first spacer region 445 may be 10 nm to 50 nm wide. In some embodiments, the first spacer region 445 includes one or more dielectrics. For example, each of the one or more dielectrics is selected from a group consisting of SiC, SiON, $Si_3N_4$, and the like. In some embodiments, the second spacer region 450 may be 1 nm to 5 nm wide. In some embodiments, the second spacer region 450 may include one or more oxides, doped glasses, and the like.

A second composite spacer protects the side walls of the capping layer 430, the second electrode 435, and the hard mask layer 440. The second composite spacer includes a third spacer region 455 and a fourth spacer region 460. In some embodiments, the third spacer region 455 may be 10 nm to 50 nm wide. In some embodiments, the third spacer region 455 includes one or more dielectrics. For example, each of the one or more dielectrics is selected from a group consisting of SiC, SiON, $Si_3N_4$, and the like. In some embodiments, the fourth spacer region 460 may be 1 nm to 5 nm wide. In some embodiments, the fourth spacer region 460 may include one or more oxides, doped glasses, and the like.

A second stop layer 465 is conformally formed over the first composite spacer, the second composite spacer, and the hard mask layer 440. A portion of the second stop layer 465 is removed to expose the central region of the second electrode 435 so that an electrical connection can be made. In some embodiments, the second stop layer 465 may vary in thickness between 30 nm and 40 nm. In some embodiments, the second stop layer 465 may form an extension to the first stop layer 415. According to some embodiments, the second stop layer 465 includes one or more dielectrics. For example, each of the one or more dielectrics is selected from a group consisting of SiC, SiON, $Si_3N_4$, and the like. In some embodiments, the second metal layer 475 may be the second metal layer 165. In some embodiments, the via 470 may be the via 160. In some embodiments, the second dielectric region 480 may be the second dielectric region 170.

The RRAM cell 400 is coupled to a second metal layer 475 through a via 470 formed between the second metal layer 475 and the second electrode 435. The upper portion of the RRAM cell is embedded in a second dielectric region 480. The second metal layer 475 may be in any metallization layer of the semiconductor device including any one of the second, third, fourth, fifth, or sixth metallization layers.

According to certain embodiments, the RRAM cell 400 may provide certain advantages over the RRAM cell 100. In some embodiments, because the side walls of the first electrode 420 and the resistive layer 425 are substantially vertical, the RRAM cell 400 does not experience as much degradation as the RRAM cell 100 during fabrication. In some embodiments, a performance of the RRAM cell 400 may meet or exceed a performance of the RRAM cell 100 using a smaller cell size. In some embodiments, RRAM cells 400 may be packed with a higher density than RRAM cells 100 resulting in greater storage capacity for semiconductor devices of a same size.

Figure 5:
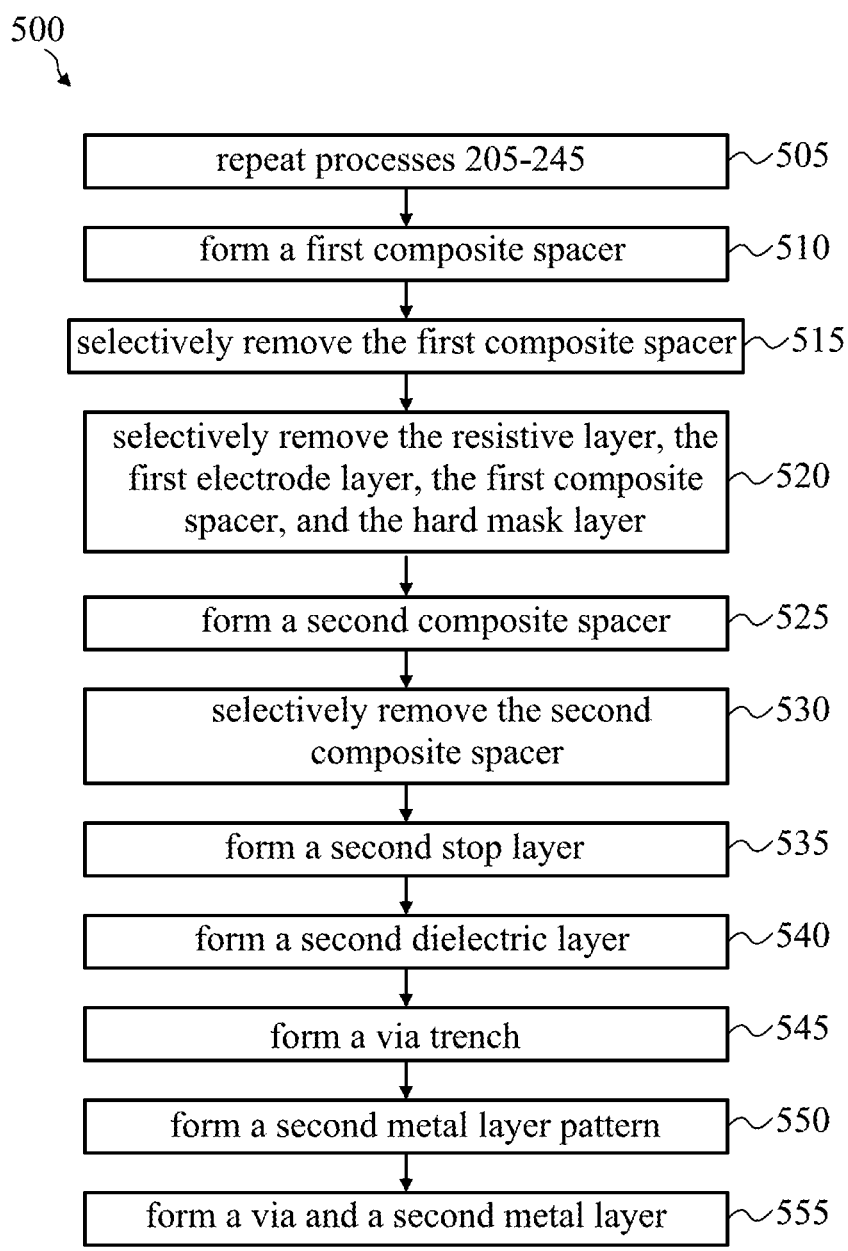
FIG. 5 is a simplified diagram showing a method for making the RRAM cell of FIG. 4 according to certain embodiments.

FIG. 5 is a simplified diagram showing a method 500 for making the RRAM cell 400 of FIG. 4 according to certain embodiments. As shown in FIG. 5, the method 500 includes a process 505 for repeating processes 205-245, a process 510 for forming a first composite spacer, a process 515 for selectively removing the first composite spacer, a process 520 for selectively removing the resistive layer, the first electrode layer, the first composite spacer, and the hard mask layer, a process 525 for forming a second composite spacer, a process 530 for selectively removing the second composite spacer, a process 535 for forming a second stop layer, a process 540 for forming a second dielectric layer, a process 545 for forming a via trench, a process 550 for forming a second metal layer pattern, and a process 555 for forming a via and a second metal layer. According to certain embodiments, the method 500 of making an RRAM cell 500 can be performed using variations among the processes 505-555 as would be recognized by one of ordinary skill in the art.

The method 500 will be further described below with reference to a series of cross-sectional images in FIGS. 3A-3F and FIGS. 6A-6I.

Figure 6A:
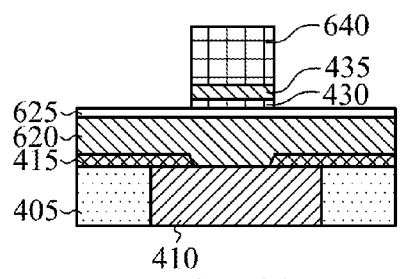
FIGS. 6A-6I show simplified diagrams of cross-sectional representations of a partially formed RRAM cell according to certain embodiments.

FIG. 6A shows a simplified diagram of a cross-sectional representation of the partially formed RRAM cell after performing the processes 205-245 during process 505. As shown in FIG. 6A, the partially formed RRAM cell includes the first dielectric region 405, the first metal layer 410, the first stop layer 415, a first electrode layer 620, a resistive layer 625, the capping layer 430, the second electrode 435, and a hard mask portion 640.

Figure 6B:
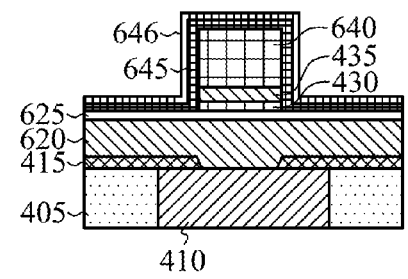

FIG. 6B shows a simplified diagram of a cross-sectional representation of the partially formed RRAM cell after a first composite spacer is conformally formed over the resistive layer 625, the capping layer 430, the second electrode 435, and the hard mask portion 640 according to certain embodiments. At the process 510 the first composite spacer is formed using a two-step process.

First, a first spacer layer 645 is conformally formed over the resistive layer 625, the capping layer 430, the second electrode 435, and the hard mask portion 640. The first spacer layer 645 is typically formed using CVD or PVD. However, any suitable deposition process may be used in process 510 to form the first spacer layer 645. In some embodiments, the first spacer layer 645 may typically have a thickness between 10 nm and 50 nm. According to some embodiments, the first spacer layer 645 includes one or more dielectrics. For example, each of the one or more dielectrics is selected from a group consisting of SiC, SiON, $Si_3N_4$, and the like.

Second, a second spacer layer 646 is conformally formed over the first spacer layer 645. The second spacer layer 646 is typically formed using plasma-enhanced CVD or through formation of doped glass. However, any suitable deposition process may be used in process 510 to form the second spacer layer 646. In some embodiments, the second spacer layer 646 may typically have a thickness between 1 nm and 5 nm. According to some embodiments, the second spacer layer 646 includes one or more oxides, doped glasses, and the like.

Figure 6C:
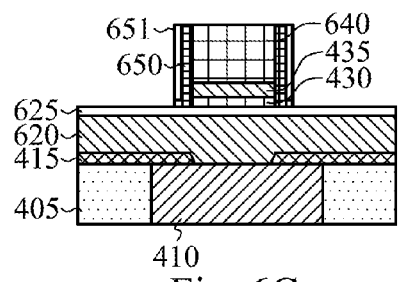

FIG. 6C shows a simplified diagram of a cross-sectional representation of the partially formed RRAM cell after portions of the first composite spacer are selectively removed according to certain embodiments. At the process 515, the first composite spacer is selectively removed using a two-step process.

The selected portions of the second spacer layer 646 are typically removed using a photolithography process using a mask to form a second spacer layer portion 651. According to some embodiments, the second spacer layer 646 may be etched using an anisotropic dry etching process, however any suitable etching process may be used.

The selected portions of the first spacer layer 645 are typically removed using a photolithography process using a mask to form a first spacer layer portion 650. According to some embodiments, the first spacer layer 645 may be etched using an anisotropic dry etching process, however any suitable etching process may be used.

Figure 6D:
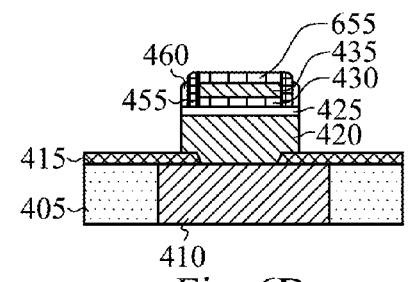

FIG. 6D shows a simplified diagram of a cross-sectional representation of the partially formed RRAM cell after portions of the resistive layer 625, the first electrode layer 620, the second spacer layer portion 651, the first spacer layer portion 650, and the hard mask layer portion 640 are selectively removed according to certain embodiments. At the process 520, the resistive layer 625, the first electrode layer 620, the second spacer layer portion 651, the first spacer layer portion 650, and the hard mask layer portion 640 are selectively removed. The selected portions of the resistive layer 625, the first electrode layer 620, the second spacer layer portion 651, the first spacer layer portion 650, and the hard mask layer portion 640 are typically removed using a photolithography process using a mask. According to some embodiments, the resistive layer 625, the first electrode layer 620, the second spacer layer portion 651, the first spacer layer portion 650, and the hard mask layer portion 640 may be etched using a dry etching process, however any suitable etching process may be used. Sufficient portions of the resistive layer 625 are removed to form the resistive 425, sufficient portions of the first electrode layer 620 are removed to form the first electrode 420, sufficient portions of the second spacer layer portion 651 are removed to form the fourth spacer region 460, sufficient portions of the first spacer layer portion 650 are removed to form the third spacer region 455, and sufficient portions of the hard mask portion 640 are removed to form a thinned hard mask portion 655. The first spacer region 455 and the second spacer region 460 substantially protect the side walls of the resistive layer 425 and the first electrode 420. In some embodiments, the side walls of the resistive layer 425 and the first electrode 420 are substantially vertical having less than a few nanometers, or even less than 1 nm, variation from vertical.

Figure 6E:
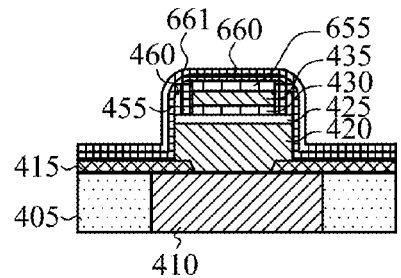

FIG. 6E shows a simplified diagram of a cross-sectional representation of the partially formed RRAM cell after a second composite spacer is conformally formed over the first stop layer 415, the first electrode 420, the resistive layer 425, the fourth spacer region 460, the third spacer region 455, and the thinned hard mask portion 655 according to certain embodiments. At the process 525 the second composite spacer is formed using a two-step process.

First, a third spacer layer 660 is conformally formed over the first stop layer 415, the first electrode 420, the resistive layer 425, the fourth spacer region 460, the third spacer region 455, and the thinned hard mask portion 655. The third spacer layer 660 is typically formed using CVD or PVD. However, any suitable deposition process may be used in process 525 to form the third spacer layer 660. In some embodiments, the third spacer layer 660 may typically have a thickness between 10 nm and 50 nm. According to some embodiments, the third spacer layer 660 includes one or more dielectrics. For example, each of the one or more dielectrics is selected from a group consisting of SiC, SiON, $Si_3N_4$, and the like.

Second, a fourth spacer layer 661 is conformally formed over the third spacer layer 660. The fourth spacer layer 661 is typically formed using plasma-enhanced CVD or through formation of doped glass. However, any suitable deposition process may be used in process 525 to form the fourth spacer layer 661. In some embodiments, the fourth spacer layer 661 may typically have a thickness between 1 nm and 5 nm. According to some embodiments, the fourth spacer layer 661 includes one or more oxides, doped glasses, and the like.

Figure 6F:
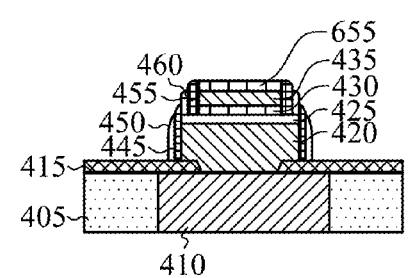

FIG. 6F shows a simplified diagram of a cross-sectional representation of the partially formed RRAM cell after portions of the second composite spacer are selectively removed according to certain embodiments. At the process 530, the second composite spacer is selectively removed using a two-step process.

The selected portions of the fourth spacer layer 661 are typically removed using a photolithography process using a mask to form the second spacer region 450. According to some embodiments, the fourth spacer layer 661 may be etched using an anisotropic dry etching process, however any suitable etching process may be used.

The selected portions of the third spacer layer 660 are typically removed using a photolithography process using a mask to form the first spacer region 445. According to some embodiments, the third spacer layer 660 may be etched using an anisotropic dry etching process, however any suitable etching process may be used.

Figure 6G:
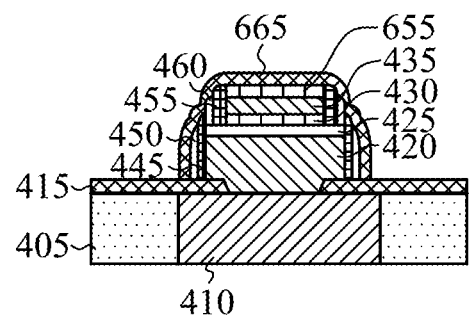

FIG. 6G shows a simplified diagram of a cross-sectional representation of the partially formed RRAM cell after a second stop layer 665 is formed according to certain embodiments. At the process 535, the second stop layer 665 is conformally formed over the second spacer region 450, the first spacer region 445, the fourth spacer region 460, the third spacer region 455, and the thinned hard mask portion 655. The second stop layer 665 is typically formed using CVD or PVD, however, any suitable deposition process may be used in process 535 to form the second stop layer 665. In some embodiments, the second stop layer 665 may have a thickness between 30 nm and 40 nm. According to some embodiments, the second stop layer 665 includes one or more dielectrics. For example, each of the one or more dielectrics is selected from a group consisting of SiC, SiON, $Si_3N_4$, and the like.

Figure 6H:
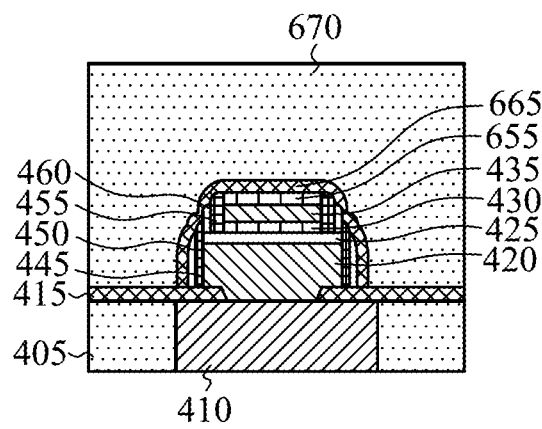

FIG. 6H shows a simplified diagram of a cross-sectional representation of the partially formed RRAM cell with a second dielectric region 670 formed thereon according to certain embodiments. At the process 540, the second dielectric region 670 is typically formed using CVD, PVD, or ALD. However, any suitable deposition process may be used in process 540 to form the second dielectric region 670. In some embodiments, the second dielectric region 670 is an interlayer dielectric region.

Figure 6I:
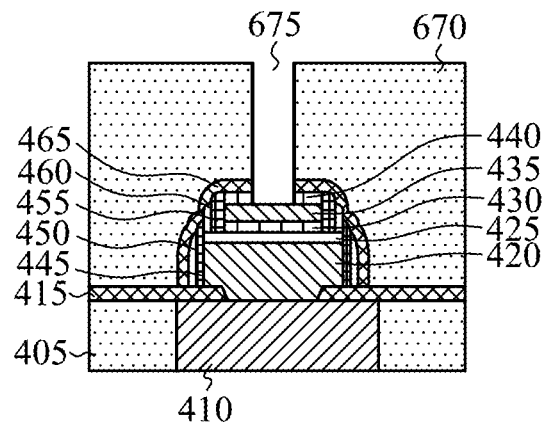

FIG. 6I shows a simplified diagram of a cross-sectional representation of the partially formed RRAM cell with a via trench 675 formed in the second dielectric region 670, the second stop layer 660, and the thinned hard mask portion 655 according to certain embodiments. At the process 545, portions of the second dielectric region 670, the second stop layer 665, and the thinned hard mask portion 655 are selectively removed to form the via trench 675. The via trench 675 is typically created using a photolithography process using a mask. According to some embodiments, the via trench 675 may require a two step etching processing. The first etching step can be used to selectively remove a portion of the second dielectric region 670 where the via trench 675 is desired. The second etching step can be used to selectively remove a portion of the second stop layer 665 and the thinned hard mask portion 350, thus forming the second stop layer 465 and the hard mask layer 440 and exposing the second electrode 435.

At the process 550, a second metal pattern is formed in the second dielectric region 670. Portions of the second dielectric region 670 are typically removed using a photolithography process using a mask to form the second metal pattern and the second dielectric region 480. According to some embodiments, the second dielectric region 670 may be etched using a dry etching process, however any suitable etching process may be used.

At the process 555, via 470 and second metal layer 475 are formed in the second dielectric region 480 to complete the RRAM cell 400 as shown in FIG. 4. The via 470 and the second metal layer 475 are typically formed using CVD, PVD, or ALD. However, any suitable deposition process may be used in process 555 to form the via 470 and the second metal layer 475.

Figure 7:
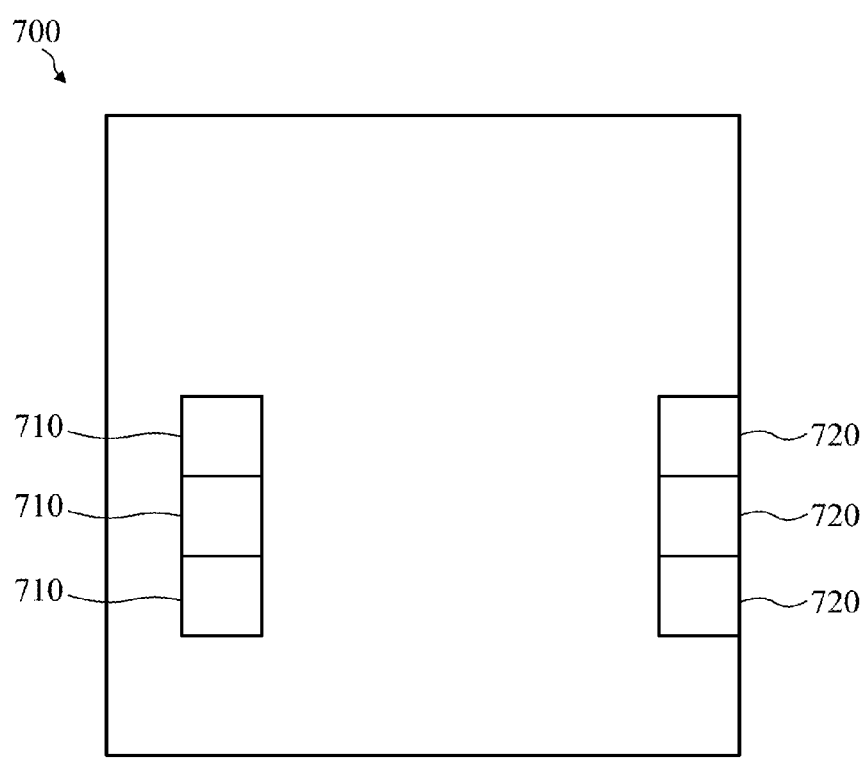
FIG. 7 is a simplified diagram of a device that includes one or more RRAM cells and I/O circuitry according to certain embodiments.

FIG. 7 is a simplified diagram of a device 700 that includes one or more RRAM cells 710 and I/O circuitry 720 according to certain embodiments. Examples of the device 700 include processors, controllers, logic devices, etc., where the RRAM cells 710 provide, at least in part, an embedded memory. In the alternative, the device 700 may be a stand-alone memory device, where a significant portion of the device 700 includes RRAM cells 710. According to certain embodiments, the RRAM cells 710 may be the RRAM cells 400.

According to certain embodiments, a memory cell formed in a semiconductor device includes a first electrode formed in an opening in a first dielectric layer, the first dielectric layer being formed on a substrate including a metal layer, the opening being configured to allow physical contact between the first electrode and the metal layer, the first electrode having a first width $W_1$ and extending a distance beyond a region defined by the opening, a resistive layer formed on the first electrode and having substantially the first width $W_1$, a capping layer, having a second width $W_2$ less than the first width $W_1$, formed on the resistive layer, a second electrode formed on the capping layer and having substantially the second width $W_2$, a first composite spacer region having at least two different dielectric layers formed on the resistive layer between the first width $W_1$ and the second width $W_2$, and a via coupled to the second electrode.

In some embodiments, the memory cell further includes a second composite spacer region having at least two different dielectric layers formed on the first dielectric layer beyond the distance. The second composite spacer region includes a first spacer region formed adjacent to side walls of the first electrode and the resistive layer and including at least one dielectric selected from a group consisting of SiC, SiON, and $Si_3N_4$ and a second spacer region formed adjacent to the first spacer region and including at least one material selected from a group consisting of an oxide and a doped glass. In some embodiments, the first spacer region varies in width between 10 nm and 50 nm and the second spacer region varies in width between 1 nm and 5 nm. In some embodiments, the first composite spacer region includes a first spacer region formed adjacent to the side walls of the second electrode and the capping layer and including at least one dielectric selected from a group consisting of SiC, SiON, and $Si_3N_4$ and a second spacer region formed adjacent to the first spacer region and including at least one material selected from a group consisting of an oxide and a doped glass. In some embodiments, the first spacer region varies in width between 10 nm and 50 nm and the second spacer region varies in width between 1 nm and 5 nm. In some embodiments, the first composite spacer extends from the first width $W_1$ to the second width $W_2$.

In some embodiments, the first electrode includes at least one material selected from a group consisting of Pt, AlCu, TiN, Au, Ti, Ta, TaN, W, WN, and Cu, the second electrode includes at least one material selected from a group consisting of Pt, AlCu, TiN, Au, Ti, Ta, TaN, W, WN, and Cu, and the first dielectric layer includes at least one material selected from a group consisting of SiC, SiON, and $Si_3N_4$. In some embodiments, the resistive layer includes at least one material selected from a group consisting of NiO, TiO, HfO, ZrO, ZnO, $WO_3$, $Al_2O_3$, TaO, MoO, and CuO. In some embodiments, the first electrode varies in thickness between 40 nm and 60 nm and the second electrode varies in thickness between 40 nm and 60 nm. In some embodiments, the resistive layer varies in thickness between 5 nm and 7 nm.

In some embodiments, the capping layer includes a least one metal selected from a group consisting of Ti and Ir and the capping layer varies in thickness between 5 nm and 7 nm. In some embodiments, side walls of the first electrode and the resistive layer vary less than 1 nm from vertical. In some embodiments, the memory cell further includes a hard mask layer formed on the second electrode. In some embodiments, the resistive layer includes a high resistance state that varies between 100 kΩ and 10 MΩ and the resistive layer includes a low resistance state that varies between 1 kΩ and 100 kΩ. According to certain embodiments, a method for forming a memory cell includes forming a substrate including a metal layer, forming a first dielectric layer on the substrate, forming a first electrode in an opening in the first dielectric layer, the opening being configured to allow physical contact between the first electrode and the metal layer, the first electrode having a first width $W_1$ and extending a distance beyond a region defined by the opening, forming a resistive layer on the first electrode and having substantially the first width $W_1$, forming a capping layer, having a second width $W_2$ less than the first width $W_1$, on the resistive layer, forming a second electrode on the resistive layer and having substantially the second width $W_2$, forming a first composite spacer region having at least two different dielectric layers on the resistive layer between the first width $W_1$ and the second width $W_2$, and coupling the second electrode to a via.

In some embodiments, forming a second composite spacer region having at least two different dielectric layers on the first dielectric layer. Forming the second composite spacer region includes forming a first spacer region adjacent to side walls of the first electrode and the resistive layer and forming a second spacer region adjacent to the first spacer region. In some embodiments, the first spacer region includes at least one dielectric selected from a group consisting of SiC, SiON, and $Si_3N_4$ and the second spacer region includes at least one material selected from a group consisting of an oxide and a doped glass. In some embodiments, forming the first composite spacer region includes forming a first spacer region adjacent to side walls of the second electrode and the capping layer including at least one dielectric selected from a group consisting of SiC, SiON, and $Si_3N_4$ and forming a second spacer region adjacent to the first spacer region including at least one material selected from a group consisting of an oxide and a doped glass. In some embodiments, side walls of the first electrode and the resistive layer are formed to vary less than 1 nm from vertical.

According to certain embodiments, a semiconductor device includes one or more memory cells. Each of the one or more memory cells includes a bottom electrode, having a first width $W_1$, formed in contact with a metallization region in an opening of a stop region formed over the metallization region, a high-k region formed above the bottom electrode and extending over the first width $W_1$, a protective region formed above a portion of the high-k region and having a second width $W_2$ less than the first width $W_1$, a top electrode formed above the protective region and having substantially the second width $W_2$, a first spacer region formed above the high-k region and adjacent to side walls of the top electrode and the protective region, a second spacer region formed above the high-k region and adjacent to the first spacer region, and a via coupled to the top electrode. The first spacer region includes at least one dielectric selected from a group consisting of SiC, SiON, and $Si_3N_4$. The second spacer region includes at least one material selected from a group consisting of an oxide and a doped glass. The second spacer region not extending beyond the first width $W_1$.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell formed in a semiconductor device, the memory cell comprising:
   a first electrode formed in an opening in a first dielectric layer, the first dielectric layer being formed on a substrate including a metal layer, the opening being configured to allow physical contact between the first electrode and the metal layer, the first electrode having a first width $W_1$ and extending a distance beyond a region defined by the opening;
   a resistive layer formed on the first electrode and having substantially the first width $W_1$;
   a capping layer, having a second width $W_2$ less than the first width $W_1$, formed on the resistive layer;
   a second electrode formed on the capping layer and having substantially the second width $W_2$;
   a first composite spacer region having at least two different dielectric layers formed on the resistive layer between the first width $W_1$ and the second width $W_2$; and
   a via coupled to the second electrode.

2. The memory cell of claim 1, further comprising:
   a second composite spacer region having at least two different dielectric layers formed on the first dielectric layer beyond the distance;
   wherein the second composite spacer region comprises:
      a first spacer region formed adjacent to the side walls of the first electrode and the resistive layer and including at least one dielectric selected from a group consisting of SiC, SiON, and $Si_3N_4$; and a second spacer region formed adjacent to the first spacer region and including at least one material selected from a group consisting of an oxide and a doped glass.

3. The memory cell of claim 2 wherein:
the first spacer region varies in width between 10 nm and 50 nm; and
the second spacer region varies in width between 1 nm and 5 nm.

4. The memory cell of claim 1 wherein the first composite spacer region comprises:
a first spacer region formed adjacent to side walls of the second electrode and the capping layer and including at least one dielectric selected from a group consisting of SiC, SiON, and $Si_3N_4$; and
a second spacer region formed adjacent to the first spacer region and including at least one material selected from a group consisting of an oxide and a doped glass.

5. The memory cell of claim 4 wherein:
the first spacer region varies in width between 10 nm and 50 nm; and
the second spacer region varies in width between 1 nm and 5 nm.

6. The memory cell of claim 1 wherein the first composite spacer extends from the first width $W_1$ to the second width $W_2$.

7. The memory cell of claim 1 wherein:
the first electrode includes at least one material selected from a group consisting of Pt, AlCu, TiN, Au, Ti, Ta, TaN, W, WN, and Cu;
the second electrode includes at least one material selected from a group consisting of Pt, AlCu, TiN, Au, Ti, Ta, TaN, W, WN, and Cu; and
the first dielectric layer includes at least one material selected from a group consisting of SiC, SiON, and $Si_3N_4$.

8. The memory cell of claim 1 wherein the resistive layer includes at least one material selected from a group consisting of NiO, TiO, HfO, ZrO, ZnO, $WO_3$, $Al_2O_3$, TaO, MoO, and CuO.

9. The memory cell of claim 1 wherein:
the first electrode varies in thickness between 40 nm and 60 nm; and
the second electrode varies in thickness between 40 nm and 60 nm.

10. The memory cell of claim 1 wherein the resistive layer varies in thickness between 5 nm and 7 nm.

11. The memory cell of claim 1 wherein:
the capping layer includes a least one metal selected from a group consisting of Ti and Ir; and
the capping layer varies in thickness between 5 nm and 7 nm.

12. The memory cell of claim 1 wherein side walls of the first electrode and the resistive layer vary less than 1 nm from vertical.

13. The memory cell of claim 1, further comprising a hard mask layer formed on the second electrode.

14. The memory cell of claim 1 wherein:
the resistive layer includes a high resistance state that varies between 100 kΩ and 10 MΩ; and
the resistive layer includes a low resistance state that varies between 1 kΩ and 100 kΩ.

15. A method for forming a memory cell, the method comprising:
forming a substrate including a metal layer;
forming a first dielectric layer on the substrate;
forming a first electrode in an opening in the first dielectric layer, the opening being configured to allow physical contact between the first electrode and the metal layer, the first electrode having a first width $W_1$ and extending a distance beyond a region defined by the opening;
forming a resistive layer on the first electrode and having substantially the first width $W_1$;
forming a capping layer, having a second width $W_2$ less than the first width $W_1$, on the resistive layer;
forming a second electrode on the resistive layer and having substantially the second width $W_2$;
forming a first composite spacer region having at least two different dielectric layers on the resistive layer between the first width $W_1$ and the second width $W_2$; and
coupling the second electrode to a via.

16. The method of claim 15, further comprising:
forming a second composite spacer region having at least two different dielectric layers on the first dielectric layer;
wherein forming the second composite spacer region comprises:
forming a first spacer region adjacent to side walls of the first electrode and the resistive layer; and
forming a second spacer region adjacent to the first spacer region.

17. The method of claim 16 wherein:
the first spacer region includes at least one dielectric selected from a group consisting of SiC, SiON, and $Si_3N_4$; and
the second spacer region includes at least one material selected from a group consisting of an oxide and a doped glass.

18. The method of claim 15 wherein forming the first composite spacer region comprises:
forming a first spacer region adjacent to side walls of the second electrode and the capping layer including at least one dielectric selected from a group consisting of SiC, SiON, and $Si_3N_4$; and
forming a second spacer region adjacent to the first spacer region including at least one material selected from a group consisting of an oxide and a doped glass.

19. The method of claim 15 wherein side walls of the first electrode and the resistive layer are formed to vary less than 1 nm from vertical.

20. A semiconductor device comprising:
one or more memory cells, each of the one or more memory cells comprising:
a bottom electrode, having a first width $W_1$, formed in contact with a metallization region in an opening of a stop region formed over the metallization region;
a high-k region formed above the bottom electrode and extending over the first width $W_1$;
a protective region formed above a portion of the high-k region and having a second width $W_2$ less than the first width $W_1$;
a top electrode formed above the protective region and having substantially the second width $W_2$;
a first spacer region formed above the high-k region and adjacent to side walls of the top electrode and the protective region, the first spacer region including at least one dielectric selected from a group consisting of SiC, SiON, and $Si_3N_4$;
a second spacer region formed above the high-k region and adjacent to the first spacer region, the second spacer region including at least one material selected from a group consisting of an oxide and a doped glass, the second spacer region not extending beyond the first width $W_1$; and
a via coupled to the top electrode.

* * * * *